United States Patent [19]

Davidson et al.

[11] Patent Number: 5,116,876
[45] Date of Patent: May 26, 1992

[54] PHOTOPOLYMERIZATION PROCESSES WITH SEPARATION OF INITIATOR LAYER FROM RESIN LAYER

[75] Inventors: Robert S. Davidson, London, England; Susan A. Wilkinson, Frankfurt, Fed. Rep. of Germany

[73] Assignee: National Research Development Corporation, London, England

[21] Appl. No.: 520,222

[22] Filed: May 3, 1990

[30] Foreign Application Priority Data

May 12, 1989 [GB] United Kingdom ............... 8910921

[51] Int. Cl.⁵ ..................... C08F 2/46; C08G 00/00; C08J 3/28; B05D 3/06
[52] U.S. Cl. ................................. 522/1; 522/31; 427/54.1; 430/271
[58] Field of Search ............... 522/1, 31; 427/54.1; 430/270

[56] References Cited

U.S. PATENT DOCUMENTS

| | | | |
|---|---|---|---|
| 2,892,712 | 6/1959 | Plambeck | 430/281 |
| 4,081,276 | 3/1978 | Crivello | 522/31 |
| 4,156,035 | 5/1979 | Tsao et al. | 427/54.1 |
| 4,193,799 | 3/1980 | Crivello | 430/319 |

FOREIGN PATENT DOCUMENTS 2023861A 1/1980 United Kingdom.

Primary Examiner—Marion E. McCamish
Assistant Examiner—Mark A. Chapman
Attorney, Agent, or Firm—Nixon & Vanderhye

[57] ABSTRACT

The polymerization of a cationically polymerizable resin especially an epoxy resin is effected by placing it adjacent to but not in contact with a layer comprising a photoinitiator. The preferred initiators are salts which comprise a fluorine atom such as hexafluorophosphate and tetrafluoroborate salts. The initiator may be irradiated separately which facilitates the curing of resins containing pigments. The products are free from contamination by unreacted initiator.

22 Claims, No Drawings

PHOTOPOLYMERIZATION PROCESSES WITH SEPARATION OF INITIATOR LAYER FROM RESIN LAYER

This invention relates to novel processes for the radiation induced polymerisation of cationically polymerisable organic resins and the products of such processes and to novel materials useful in the aforesaid processes.

The photopolymerisation of cationically polymerisable organic resins especially epoxy resins offers clear advantages compared to conventional heat curing processes in terms of reduced energy consumption and reduced air pollution. A wide range of photoinitiators have been proposed for use in such processes. The processes conventionally involve mixing the initiator with the uncured resin and subsequently exposing the mixture to radiation. These mixtures tend to deteriorate upon prolonged storage. Furthermore the curing process is less effective where the sensitivity of the initiator is reduced, e.g. by the presence of aromatic epoxy resins or pigment materials. Also these processes result in the contamination of the cured resin with unreacted initiator and residues produced by the irradiation of the initiator. A modified procedure is described in USP 40B1276 wherein the initiator is applied to a surface and selectively irradiated. An uncured resin is then contacted with the surface and the resin is found to selectively cure at those points at which the surface was irradiated.

He have now discovered a process which alleviates certain of the above disadvantages and provides advantageous polymerisation processes and products. In particular we have discovered that where the photoinitiator is a compound which upon irradiation is capable of decomposing to form a volatile acidic species or a precursor of such a species those volatile compounds are effective in initiating polymerisation of the uncured resin.

Accordingly, from one aspect. this invention provides a process for the polymerisation of a cationically polymerisable resin wherein a first layer comprising a radiation sensitive initiator is positioned adjacent to but not in contact with a second layer comprising the uncured or partially cured resin and the first layer is irradiated.

The processes of this invention employ separate compositions. one comprising an initiator which is a radiation sensitive compound and a second comprising the resin. These compositions are storage stable and their use in the processes of this invention produces a cured product which is not contaminated by the presence of unreacted initiator or the non-volatile residues of the initiator. These products are believed to be novel and constitute a further aspect of the invention. Furthermore the presence of components such as aromatic epoxy resins or pigments in the resin compositions which has previously reduced the sensitivity of the resin is not a problem since the initiator may be irradiated separately.

The preferred initiators for use in the processes of the present invention are salts which contain a halogen atom as part of the molecular structure of the anion. Preferably the anion comprises an element M from group III. IV or V of the periodic table which is capable of forming at least one such anion. Thus the anion may be selected from those having the general formula $[MX_n]^{(n-a)}$ where X represents a halogen atom, n is an integer having a value of from 3 to 8 and a is the valence of the element M. Preferably M is selected from the group comprising boron, phosphorus, arsenic. antimony and bismuth. The preferred anions are those which comprise fluorine atoms although compounds comprising chlorine. bromine or iodine may be utilised. The preferred initiators are those which comprise a tetrafluoroborate hexafluorophosphate, hexafluoroarsenate or hexafluoroantimonate anion.

The counter-ion for these anions may be any ion which renders the salt sensitive to radiation. A large number of such anions have been proposed for addition to cationically polymerisable resins in order to render them susceptible to photo-initiated polymerisation and can be identified by reference to standard works in the art, e.g. U. V. Curing Science and Technology. edited by S. P. Pappas and published by Technology Marketing Corporation 1978. Examples of classes of counterions include all those disclosed by J.V. Crivello in "Advances in Polymer Science. Vol. 62, pages 1–48. published by Springer-Verlag Berlin 1984. Particular examples are aryl diazonium salts especially diazonium fluoroborates and diazonium hexa fluorophosphates. aryl onium salts derived from elements in Group VII of the Periodic Table especially iodonium, bromonium or chloronium salts or from Group VI of the Periodic Table especially sulphonium. oxonium. selenonium and telluronium salts or from Group V of the Periodic Table especially nitronium. phosphonium. arsonium and antimonium salts. The preferred salts are diazonium, iodonium, sulphonium. phosphonium. antimonium and arsonium salts. These salts will comprise at least one aryl group containing substituent. Representative examples of cations which can form such salts are listed below.

(a) Diaryl iodonium salts such as

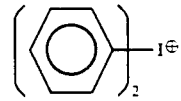

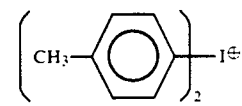

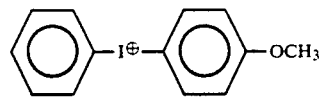

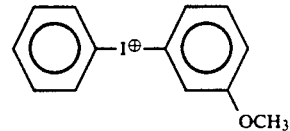

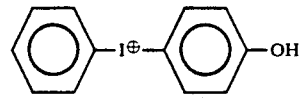

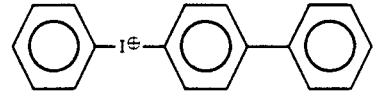

-continued
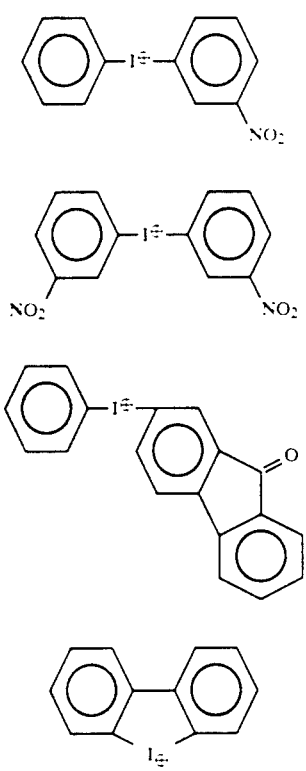
(b) Triaryl sulphonium salts such as
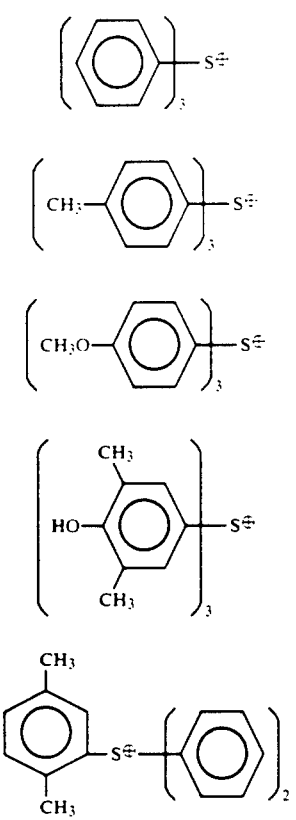
-continued
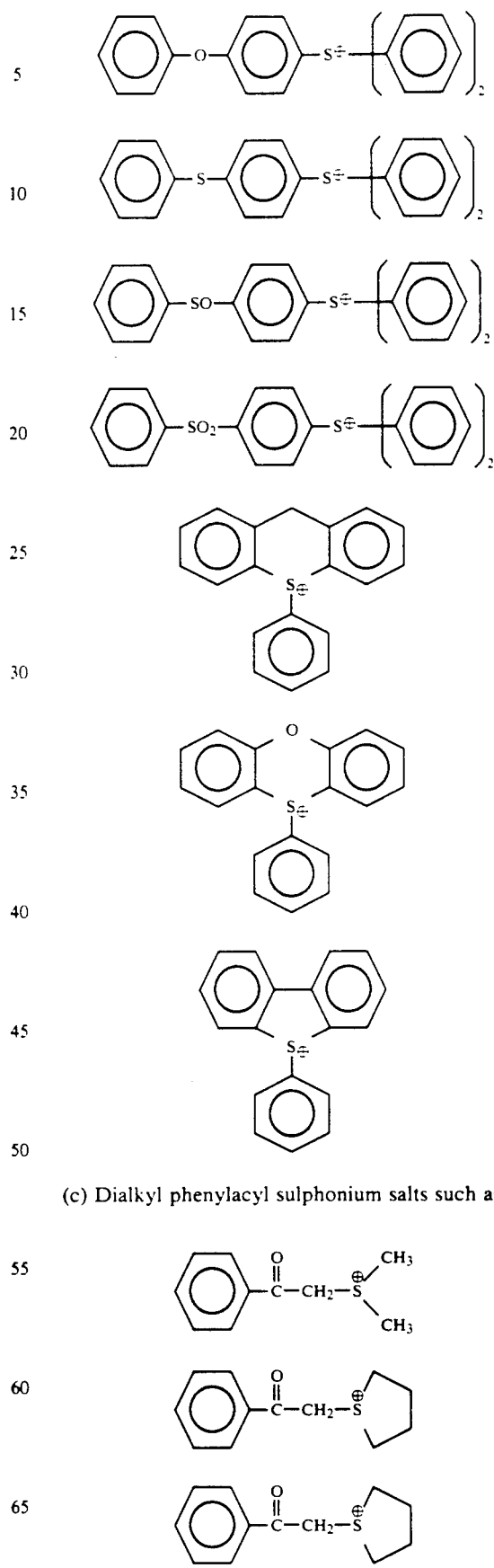
(c) Dialkyl phenylacyl sulphonium salts such as -continued

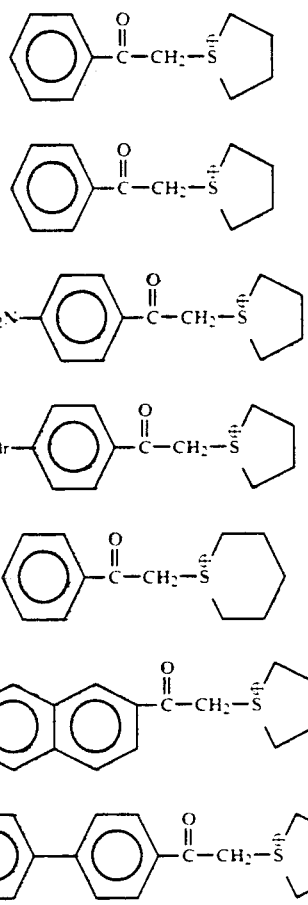

(d) Dialkyl-4-hydroxyphenylsulphonium salts such as

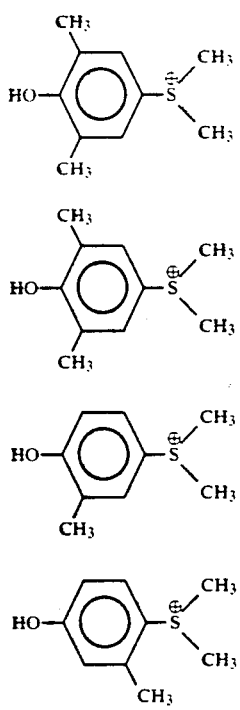

-continued

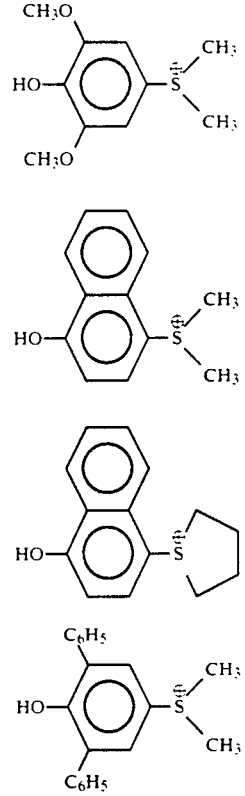

Other groups of counter-ions which may be employed are organo-metallic complexes such as iron-arene complexes such as ($n^5$-2,4,-cyclopenta-dien-1-yl)((1,2,3,4,5,6-n)-(1-methyl ethyl) benzenel-iron(1+)-hexafluorophosphate (1−), thiopyrilium salts, sulphoxonium salts and carbamyl sulphoxonium salts.

The volatile acidic species released by irradiation of the initiator may be a Lewis acid or a Bronsted acid or a precursor of such an acid. More than one such acid species may be generated. The precise nature of the volatile species may not have a critical effect upon the processes of this invention.

The species released by the irradiation may be one which is susceptible to hydrolysis and the products of that hydrolysis may be volatile acidic species. Initiators which release products which act as precursors and subsequently form volatile acidic species are useful in the processes of this invention.

The process of this invention may conveniently be carried out by forming a first layer comprising the initiator and a second layer comprising the uncured or partially cured resin. The two layers are arranged adjacent to but not in contact with one another in such a manner that volatile products evolved from the first layer come into contact with the surface of the second layer. The processes of the invention are preferably carried out under controlled conditions. Although the process may conveniently be carried out in air the moisture content of the air will preferably be controlled so as to be less than that level which will inhibit the polymerisation reaction.

The two layers are preferably mounted in a manner such that the gap between the layer comprising the initiator and the layer comprising the resin can be set and adjusted as desired. Generally the gap will be adjusted so as to be at least 1mm and more usually at least 2mm and generally less than 10 and usually less than 5mm. However larger gaps may be useful in particular processes.

The first layer comprising the initiator may be formed using conventional techniques. Thus the initiator may conveniently be dissolved in an inert solvent which may be a volatile solvent such as acetone. ethanol or acetonitrile or a relatively involatile solvent such as propylene carbonate. The solution obtained may be used to soak a supporting web or spread as a thin film on a suitable surface and the solvent evaporated. A wide variety of materials may be used as a support for the initiator in this layer. Preferably the support is one which is substantially transparent to the source of radiation which is to be employed in the process. This enables the initiator to be deposited on one face of the support and the layer to be irradiated from the opposite face. Such compositions are believed to be novel and constitute a further aspect of this invention. In another preferred embodiment the support is one which is inert in relation to the volatile products of the irradiation. Examples of suitable materials which can be used as a support medium include polyolefins such as polyethylene and polyesters such as polyvinylacetate. The first layer may also comprise a sensitiser which additives are conventionally employed in order to increase the sensitivity of the initiator to radiation of shorter wavelengths. The use of such additives is especially valuable when the initiator is a diazonium salt.

The second layer comprising the uncured or partially cured resin may comprise any cationically polymerisable system. Examples of resins which can be polymerised in this way include epoxy resins, vinyl ethers. cyclic ethers. cyclic acetals and cyclic hemi-acetals. The process of this invention finds particular application to the curing of systems which can be formed into a film or layer. The resins used are therefore preferably those which do not "run" when formed into such a layer.

Suitable materials are, for example. epoxy resins which include any monomeric, dimeric or oligomeric or polymeric epoxy material containing one or a plurality of epoxy functional groups. For example. those resins which result from the reaction of bis-phenol-A {4.4-isopropylidenediphenol}and epichlorohydrin. or by the reaction of low molecular weight phenol-formaldehyde resins (Novolak resins) with epichlorohydrin. can be used alone or in combination with an epoxy containing compound as a reactive diluent. The processes of this invention find particular application in the curing of aromatic epoxy resins such as those based on Bis phenol A which screen the radiation and reduce the efficiency of the initiation in the conventional process.

In addition, the range of the compounds to be polymerised can be extended to include polymeric materials containing terminal or pendant epoxy groups. Examples of these compounds are vinyl copolymers containing glycidyl acrylate or methacrylate as one of the comonomers. Other classes of epoxy containing polymers are epoxy-siloxane resins. epoxy-polyurethanes and epoxy-polyesters. Such polymers usually have epoxy functional groups at the ends of their chains. Epoxy-siloxane resins and method for making are more particularly shown by E.P. Pluedemann and G. Fanger, J.Am.-Chem.Soc. BO 632-5 (1959). As described in the literature. epoxy resins can also be modified in a number of standard ways such as reactions with amines, carboxylic acids, thiols, phenols. alcohols, etc., as shown in U.S. Pat. Nos. 2.935.488. 3.235.620. 3.369.055; 3.379.653; 3.398.211; 3.403.199; 3.563.850; 3.567.797; 3.677.995; etc. Further examples of epoxy resins which can be used are shown in the Encylcopaedia of Polymer Science and Technology, Vol.6. 1967. Interscience Publishers, New York, pp 209.271.

Additional examples of cationically polymerizable organic materials include vinyl organic monomers. such as styrene. vinyl acetamide. α-methyl styrene. isobutyl vinylether, n-octyl vinylether. acrolein. 1.1-diphenylethylene, B-pinene; vinyl arenes such as 4-vinyl biphenyl. 1-vinyl pyrene, 2-vinyl fluorene, acenaphthylene. 1 and 2-vinyl naphthylene., 9-vinyl carbazole. vinyl pyrrolidone. 3-methyl-1-butene; vinyl cycloaliphatics such as vinylcyclohexane. vinylcyclopropane, 1-phenylvinylcyclopropane.. dienes such as isobutylene, isoprene, butadiene. 1,4-pentadiene, etc.

Some of the vinyl organic prepolymers which can be used in the present invention are, for example, $CH_2=CH-O-(CH_2-CH_2O)_2-CH=CH_2$ where n is a positive integer having a value up to about 1000 or higher; multi-functional vinylethers such as 1.2.3-propane trivinyl ether. trimethylolpropane trivinyl ether, low molecular weight polybutadiene having a viscosity of from 200 to 10,000 centipoises at 25° C. etc.

A further class of resins which may be cured in the processes of this invention are partially cured resin systems since these may be rendered particularly sensitive to photopolymerisation and hence find use as lithographic plates in the printing industries.

Such a system could comprise a cationically cured material such as an epoxide and a resin cured by a free radical process such as an acrylate. Exposure of the mixture to the gases liberated by irradiation would lead to polymerisation of the epoxy groups. This in effect would presensitize a plate. Removal of the film so produced and then exposure to direct ultraviolet light would complete the photopolymerisation process using acrylate groups. If a mask were placed between the light source and the film an image would be produced. Preferably a free radical initiator would be incorporated into the mixture prior to curing.

A further category of the organic materials which can be used are cyclic ethers which are convertible to thermoplastics. Included by such cyclic ethers are, for example, oxetanes such as 3,3-bis-chloromethyloxetane. alkoxyoxetanes as shown by Schroeter U.S. Pat. No. 3,673,216. oxolanes such as tetrahydrofuran, oxepanes, oxygen containing spiro compounds, trioxane, dioxolane, etc.

In addition to cyclic ethers there are also included cyclic esters such as β-lactones, for example, propiolactone, cyclic amines. such as 1.3.3-trimethylazetidine and organosilicon cyclics. An example of an organosilicon cyclic is hexamethyl trisiloxane, octamethyl tetrasiloxane, etc.

The source of the radiation used in the photopolymerisation processes of this invention may be any of the conventional sources, e.g. a u.v. lamp, a metal halogen lamp or any suitable electron beam generator. The intensity of the radiation and the exposure time can be adjusted through a wide range according to the nature of a particular process. These parameters will be adjusted so as to ensure that a sufficient concentration of the volatile products of the irradiation is generated so that the resin is cured at the desired speed. As with conventional photopolymerisation processes once the polymerisation has been initiated it proceeds even when the resin is no longer exposed to the initiator. Thus the resin need only be exposed to the volatile acidic species for sufficient time to initiate the polymerisation.

The process of this invention may also be utilised to produce images based on the resin. The insertion of a mask between the two layers enables only a portion of the surface of the resin to be exposed to the initiator and hence cured. Thus use of such a mask may be useful. e.9. in the production of printed circuit boards.

The invention is illustrated by the following examples

EXAMPLE 1

Films comprising onium salt initiators were deposited by evaporation of solutions of the salts in acetonitride or methanol at 50° C. using a vacuum from the surface of aluminium foil (0.051mm gauge). The onium salts used were Diphenyliodonium hexafluorophosphate (DPI)
Triphenylsulphonium hexafluorophosphate (TPS)

In each case the product was supplied by Ciba Geigy Ltd and used as such.

The coated film was placed inside a quartz tube which had previously been dried at 120° C for a period of 2 hours.

Thin films of 3,4-Epoxycyclohexylmethyl-3',4'-epoxycyclohexane carboxylate (previously dried over molecular sieves) were coated onto aluminium foil sheets using a hand K-bar coating unit. These films were then placed above but not in contact with the film of the salts in the quartz tube. The tube was purged with dry nitrogen and the epoxide coating shielded from exposure to u.v. radiation. Irradiation was carried out by rotating the salts in the tube around a water cooled medium pressure mercury lamp (Applied Photophysics Ltd. 450 watts}for a given period of time.

The times necessary to achieve 50% of and 100% cure of the resin were as follows

|      | DPI     | TPS      |
|------|---------|----------|
| 50%  | 47 mins | 68 mins  |
| 100% | 92 mins | 132 mins |

EXAMPLE 2

0.11 gm of diphenyliodonium hexafluorophosphate was dissolved in 0.4 ml of acetone and the solution dripped onto a cellulose filter paper. The filter paper was dried in a hot air stream for five minutes after which the solvent had evaporated.

0.0275 gm of a cycloaliphatic epoxy resin sold under the trade mark UVR 6110 by the Union Carbide Corporation (3,4 epoxycyclohexylmethyl-3',4'-epoxycyclohexane carboxylate) was applied to the surface of an aluminium plate having an area of 12.2 cm². The resin was spread evenly over the surface.

The plate and filter paper were mounted in a gas tight chamber in a manner such that their surfaces did not touch but were no more than 10 mm apart. The surface of the paper upon which the initiator had been deposited faced away from the resin. That face was irradiated at a distance of 7 cms for a period of 45 minutes. At the end of that time the resin surface was inspected and found to be hard and glossy in appearance.

EXAMPLE 3

The procedure of Example 2 was repeated using equivalent quantities of the following initiators 1. ($n^5$-2,4-cyclopentadien-1-yl)(1,2,3,4,5,6-n-{1-methyl ethyl)-benzene]-iron (+1) hexafluorophosphate (−1).
] 2. Triphenyl Sulphonium hexafluoroantimonate.
3. Triphenyl Sulphonium hexafluorophosphate*.
* supplied as a solution in propylene carbonate 3 ml of that solution was dripped onto the surface of a borosilicate glass fibre filter paper.

In each case the resin cured to form a hard glossy film at the end of the process.

EXAMPLE 4

The procedure of Example 2 was duplicated using a film formed from a cyclohexane diepoxide resin sold by the Fluka Chemical Company. The procedure was repeated using the initiators described in Example 3.

In each case the resin cured to form a hard glossy film.

What we claim is:

1. A process for the polymerization of a cationically polymerizable resin, said process comprising the steps of:

positioning a first layer comprising a radiation sensitive initiator adjacent to but not in contact with a second layer comprising the uncured or partially cured resin in a manner such that volatile species produced as a result of irradiating said first layer come into contact with said second layer; and
irradiating the first layer.

2. A process according to claim 1, wherein the initiator is a salt which contains a halogen atom as part of the molecular structure of the anion.

3. A process according to claim 2, wherein the initiator is a salt wherein anion has t he general formula $[MXn]^{[n-a]}$wherein X represent a halogen atom, n is an integer having a value of from 3 to 8, M is an element from Group III, IV or V of the Periodic Table and a is the valence of element M.

4. A process according to claim 3, wherein M represents an element selected from the grop consisting boron, phosphorus, arsenic, antimony and bismuth.

5. A process according to claim 2, wherein the halogen atom is a fluorine atom.

6. A process according to claim 2, wherein the initiator comprises an anion selected from the group consisting of tetrafluoroborate, hexafluorophosphate, hexafluoroarsenate and hexafluoroantimonate anions.

7. A process according to claim 2, wherein the initiator is an aryl diazonium salt.

8. A process according to claim 2, wherein the initiator is an aryl onium salt.

9. A process according to claim 8, wherein the initiator is an iodonium salt.

10. A process according to claim 9, wherein the initiator is diphenyliodonium hexafluorophosphate.

11. A process according to claim 8, wherein the initiator is a sulphonium salt.

12. A process according to claim 11, wherein the initiator is a triphenylsulphonium salt.

13. A process according to claim 12, wherein the initiator is triphenylsulphonium hexafluorophosphate.

14. A process according to claim 12, wherein the initiator is triphenylsulphonium hexafluoroantimonate.

15. A process according to claim 8, wherein the initiator is an iron-arene complex.

16. A process according to claim 15, wherein the initiator is ($n^5$-2,4-cyclopenta-dien-1-yl)-iron(1+)-hexafluorophosphate.

17. A process according to claim 1, wherein the first layer is positioned between 1 and 10 mm from the second layer.

18. A process according to claim 1, wherein the resin is an epoxy resin.

19. A process according to claim 1, wherein the resin is a resin system comprising a cationically curable resin and radical curable resin.

20. A process according to claim 19, wherein the curing of the cationically curable resin is followed by the curing of the radical curable resin.

21. A process according to claim 20, herein the radical curable resin is an acrylic resin.

22. A process according to claim 19, wherein the radical curable resin is an acrylic resin.

* * * * *